(12) United States Patent
Je et al.

(10) Patent No.: US 11,107,844 B2
(45) Date of Patent: Aug. 31, 2021

(54) DISPLAY DEVICE

(71) Applicant: LG DISPLAY CO., LTD., Seoul (KR)

(72) Inventors: SoYeon Je, Goyang-si (KR); Hyuk Ji, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/993,198

(22) Filed: May 30, 2018

(65) Prior Publication Data

US 2019/0198534 A1 Jun. 27, 2019

(30) Foreign Application Priority Data

Dec. 22, 2017 (KR) .................. 10-2017-0177833

(51) Int. Cl.
*H01L 27/12* (2006.01)
*H01L 29/786* (2006.01)
(Continued)

(52) U.S. Cl.
CPC .... *H01L 27/1251* (2013.01); *H01L 21/02532* (2013.01); *H01L 21/02565* (2013.01); *H01L 21/02592* (2013.01); *H01L 21/02667* (2013.01); *H01L 27/124* (2013.01); *H01L 27/1222* (2013.01); *H01L 27/1225* (2013.01); *H01L 27/1248* (2013.01); *H01L 27/1274* (2013.01); *H01L 29/66757* (2013.01); *H01L 29/66969* (2013.01); *H01L 29/7869* (2013.01); *H01L 29/78618* (2013.01); *H01L 29/78675* (2013.01); *H01L 29/78696* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS

2014/0159037 A1 6/2014 Kwon et al.
2016/0064421 A1* 3/2016 Oh ..................... H01L 27/1222
257/43
(Continued)

FOREIGN PATENT DOCUMENTS

KR 10-2014-0076471 A 6/2014
KR 10-2017-0080047 A 7/2017

*Primary Examiner* — Shaun M Campbell
*Assistant Examiner* — Aneta B Cieslewicz
(74) *Attorney, Agent, or Firm* — Birch, Stewart, Kolasch & Birch, LLP (57) ABSTRACT

A display device can include a first thin film transistor including a first active layer including a first semiconductor material, a first gate electrode overlapping with the first active layer, and a first source electrode and a first drain electrode both electrically connected to the first active layer; a separation insulating layer disposed on the first thin film transistor; and a second thin film transistor disposed on the separation insulating layer and including: a second active layer including a second semiconductor material different from the first semiconductor material, a second gate electrode overlapping with the second active layer, and a second source electrode and a second drain electrode both electrically connected to the second active layer, in which the second active layer of the second thin film transistor has a first thickness and a second thickness greater than the first thickness.

17 Claims, 3 Drawing Sheets

(51) Int. Cl.
*H01L 51/52* (2006.01)
*H01L 21/02* (2006.01)
*H01L 29/66* (2006.01)
*H01L 21/4757* (2006.01)
*H01L 21/443* (2006.01)
*H01L 27/32* (2006.01)
*H01L 51/56* (2006.01)
*H01L 21/4763* (2006.01)

(52) U.S. Cl.
CPC ...... *H01L 21/02274* (2013.01); *H01L 21/443* (2013.01); *H01L 21/47573* (2013.01); *H01L 21/47635* (2013.01); *H01L 27/1266* (2013.01); *H01L 27/1288* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 51/5253* (2013.01); *H01L 51/56* (2013.01); *H01L 2227/323* (2013.01)

(56) References Cited

U.S. PATENT DOCUMENTS

| | | | |
|---|---|---|---|
| 2016/0284733 A1* | 9/2016 | Lee | H01L 27/124 |
| 2018/0277614 A1* | 9/2018 | Ono | H01L 29/7869 |
| 2019/0115407 A1* | 4/2019 | Cho | G09G 3/3225 |

* cited by examiner

DISPLAY DEVICE

CROSS-REFERENCE TO RELATED APPLICATIONS

This application claims the priority of Korean Patent Application No. 10-2017-0177833 filed in the Republic of Korea on Dec. 22, 2017, which is incorporated herein by reference in its entirety.

BACKGROUND OF THE INVENTION

Field of the Invention

The present disclosure relates to a display device in which a plurality of thin film transistors is formed of different semiconductors.

Description of the Related Art

As information technology has developed, a display field has been developed that can represent information contained in an electrical information signal in the form of visual images. Thus, various display devices having excellent performance such as thin thickness, light weight, and low power consumption properties have been developed.

Specific examples of the above-mentioned display device may include a liquid crystal display device (LCD), and electroluminescence display devices such as an organic light emitting display device (OLED) and a quantum dot light emitting display device (QLED).

A display device includes an active area for displaying an image. In the active area, a plurality of thin film transistors is positioned in a pixel circuit and a driving circuit to drive elements disposed in a plurality of pixels. A process of manufacturing the plurality of thin film transistors includes a process of forming a hole penetrating through a plurality of layers. During the process of forming a hole, a semiconductor device may be damaged. For example, during a process of manufacturing semiconductor devices exposed through holes having different depths, a semiconductor device exposed through a relatively shallow hole may be damaged. Surface damage of a semiconductor device exposed through a hole during a manufacturing process may cause a decrease in driving performance of the semiconductor device and a decrease in reliability of the display device.

SUMMARY OF THE INVENTION

The inventors of the present disclosure recognized that in a method of manufacturing a display device, driving characteristics of pixels can be improved by forming a plurality of thin film transistors made of different semiconductors.

Accordingly, the inventors of the present disclosure invented a display device in which semiconductors for a plurality of thin film transistors are formed on different layers, respectively, to form the plurality of thin film transistors of different semiconductors and damage to semiconductor devices can be reduced.

An object achieved by the present disclosure is to provide a thin film transistor and a display device in which a plurality of thin film transistors is formed of different semiconductor materials, and, thus, damage to semiconductor devices is reduced when the display device is manufactured.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device includes a first thin film transistor including a first active layer formed of a first semiconductor material, a first gate electrode overlapped with the first active layer on a first gate insulating layer which disposed on the first active layer, and a first source electrode and a first drain electrode electrically connected to the first active layer. The display device further includes a separation insulating layer on the first thin film transistor. The display device further includes a second thin film transistor disposed on the separation insulating layer and including a second active layer formed of a second semiconductor material different from the first semiconductor material, a second gate electrode overlapped with the second active layer on a second gate insulating layer which disposed on the second active layer, and a second source electrode and a second drain electrode electrically connected to the second active layer. Further, the second active layer of the second thin film transistor may have a first thickness and a second thickness greater than the first thickness.

According to another aspect of the present disclosure, there is provided a display device. The display device includes a first thin film transistor including a first active layer including a first channel region, a first source region and a first drain region, and the first active layer is formed of a first semiconductor material, a first gate electrode overlapping with the first active layer, and a first source electrode and a first drain electrode both electrically connected to the first active layer. The display device further includes a second thin film transistor including a second source region formed as a plurality of layers and a second drain region formed as a plurality of layers, a second active layer including a second channel region formed as a single layer, the second active layer is formed of a second semiconductor material different from the first semiconductor material, and second active layer is electrically connected to second source region and the second drain region, a second gate electrode overlapped with the second channel region of the second active layer, and a second source electrode and a second drain electrode connected to the second source region and the second drain region of the second active layer, respectively. The display device further includes a separation insulating layer disposed between the first thin film transistor and the second thin film transistor. Other detailed matters of the embodiments are included in the detailed description and the drawings.

According to the present disclosure, thin film transistors including different semiconductor materials from each other are disposed. Thus, the reliability of a display device can be improved.

Further, according to the present disclosure, when thin film transistors including different semiconductor materials from each other are formed, an active layer in an area not overlapped with a gate electrode of a thin film transistor has a greater thickness than an active layer in an area overlapped with the gate electrode. Thus, it is possible to reduce the loss of the active layer occurring when forming a contact hole penetrating through an interlayer insulating layer on the active layer.

Furthermore, according to the present disclosure, when thin film transistors including different semiconductor materials from each other are formed, an active layer in an area overlapped with a gate electrode of a thin film transistor can be formed as a single layer. Further, an active layer in an area not overlapped with the gate electrode can be formed as a plurality of layers. Thus, it is possible to reduce the loss of the active layer occurring when forming a contact hole penetrating through an interlayer insulating layer on the active layer.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for the convenience of description, and the present disclosure is not limited to the size and the thickness of the component illustrated.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, various embodiments of the present disclosure will be described in detail with reference to accompanying drawings.

A display device according to the present disclosure can be applied to electroluminescence display devices such as an organic light emitting display device (OLED) or a quantum dot light emitting display device (QLED), but is not limited thereto. The display device according to the present disclosure can be applied to various display devices. For example, the display device according to the present disclosure can be applied to a liquid crystal display device (LCD).

Figure 1:
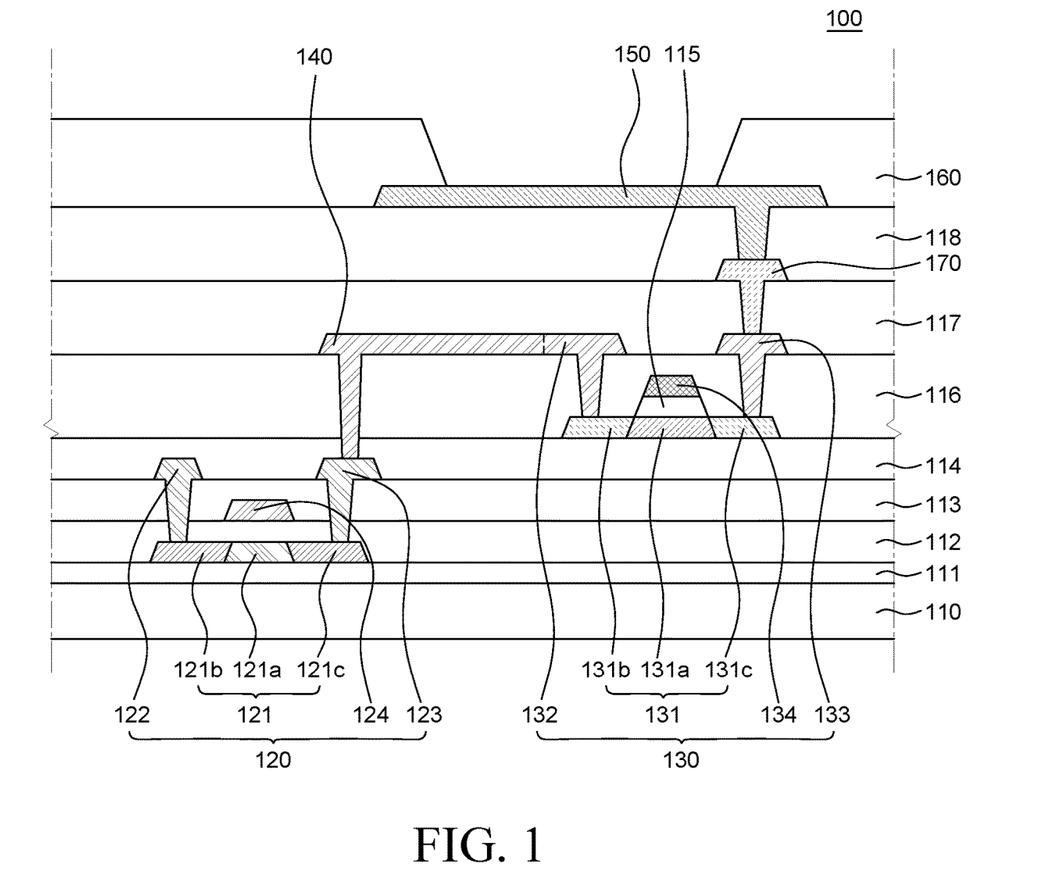
FIG. 1 is a cross-sectional view illustrating a display device according to an embodiment of the present disclosure.

FIG. 1 is a cross-sectional view illustrating a display device according to an embodiment of the present disclosure.

Referring to FIG. 1, a display device 100 according to an embodiment of the present disclosure includes a substrate 110, a buffer layer 111, a first thin film transistor 120, and a second thin film transistor 130. The display device 100 further includes a first gate insulating layer 112, a first interlayer insulating layer 113, a separation insulating layer 114, a second gate insulating layer 115, and a second interlayer insulating layer 116. The display device 100 further includes a passivation layer 117, a planarization layer 118, a first electrode 150, a connecting electrode 140, a bank 160, and a first auxiliary electrode 170.

The substrate 110 supports various components of the display device 100. The substrate 110 may be formed of glass or a plastic material having flexibility. The substrate 110 may be formed of a plastic material such as polyimide (PI). When the substrate 110 is formed of polyimide (PI), a supporting substrate formed of glass is disposed under the substrate 110 during a manufacturing process of the display device 100. After the manufacturing process of the display device 100, the supporting substrate may be released. Further, after the supporting substrate is released, a back plate for supporting the substrate 110 may be disposed under the substrate 110.

The buffer layer 111 may be formed on the entire surface of the substrate 110. The buffer layer 111 may be formed as a single layer of silicon nitride (SiNx) or silicon oxide (SiOx) or a multi-layer of silicon nitride (SiNx) and silicon oxide (SiOx). The buffer layer 111 may function to improve the adhesive strength between the substrate 110 and layers formed on the buffer layer 111 and block alkali elements leaking from the substrate 110. The buffer layer 111 may be omitted based on the kind and material of the substrate 110 and the structure and type of the thin film transistor.

The first thin film transistor 120 may be disposed on the buffer layer 111. The first thin film transistor 120 may include a first active layer 121, a first gate electrode 124, a first source electrode 122, and a first drain electrode 123.

The first active layer 121 of the first thin film transistor 120 may be disposed on the buffer layer 111.

The first active layer 121 may include low temperature poly-silicon (LTPS). A poly-silicon material has high mobility (100 cm$^2$/Vs or more) and thus has advantages such as low energy consumption and excellent reliability. Therefore, the poly-silicon material can be applied to a gate driver for driving elements configured to drive thin film transistors for display elements and/or a multiplexer (MUX). In the display device according to an embodiment, the poly-silicon material may be applied to an active layer of a driving thin film transistor, but may not be limited thereto. For example, the poly-silicon material may be applied to an active layer of a switching thin film transistor depending on characteristics of the display device. An amorphous silicon (a-Si) material is deposited on the buffer layer 111 and poly-silicon is formed by performing a dehydrogenation process and a crystallization process thereto. The first active layer 121 may be formed by patterning the poly-silicon. The first active layer 121 may include a first channel region 121a in which a channel is formed when the first thin film transistor 120 is driven, and a first source region 121b and a first drain region 121c on both respective sides of the first channel region 121a. The first source region 121b refers to a part of the first active layer 121 connected to the first source electrode 122, and the first drain region 121c refers to a part of the first active layer 121 connected to the first drain electrode 123. The first source region 121b and the first drain region 121c may be formed by ion doping (impurity doping) of the first active layer 121. The first source region 121b and the first drain region 121c may be formed by performing ion doping to a poly-silicon material. The first channel region 121a refers to a part of the first active layer 121 which is not ion-doped and remains as the poly-silicon material.

The first gate insulating layer 112 may be disposed on the first active layer 121 of the first thin film transistor 120. The first gate insulating layer 112 may be formed as a single layer of silicon nitride (SiNx) or silicon oxide (SiOx) or a multi-layer of silicon nitride (SiNx) and silicon oxide (SiOx). In the first gate insulating layer 112, the first source electrode 122 and the first drain electrode 123 of the first thin film transistor 120 include contact holes for contact with the first source region 121b and the first drain region 121c, respectively, of the first active layer 121 of the first thin film transistor 120.

The first gate electrode 124 of the first thin film transistor 120 may be disposed on the first gate insulating layer 112. The first gate electrode 124 may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof. The first gate electrode 124 may be formed on the first gate insulating layer 112 to be overlapped with the first channel region 121a of the first active layer 121 of the first thin film transistor 120.

The first interlayer insulating layer 113 may be formed on the first gate insulating layer 112 and the first gate electrode 124. The first interlayer insulating layer 113 may be formed as a single layer of silicon nitride (SiNx) or silicon oxide (SiOx) or a multi-layer of silicon nitride (SiNx) and silicon oxide (SiOx). The first interlayer insulating layer 113 may include contact holes for exposing the first source region 121b and the first drain region 121c of the first active layer 121 of the first thin film transistor 120.

The first source electrode 122 and the first drain electrode 123 may be formed on the first interlayer insulating layer 113. The first source electrode 122 and the first drain electrode 123 may be connected to the first active layer 121 through the contact holes formed in the first interlayer insulating layer 113 and the first gate insulating layer 112. For example, the first source electrode 122 and the first drain electrode 123 may be electrically connected to the first source region 121b and the first drain region 121c, respectively, of the first active layer 121 through the contact holes formed in the first interlayer insulating layer 113 and the first gate insulating layer 112. The first source electrode 122 and the first drain electrode 123 may be formed of a conductive metal material and may have a three-layer structure of titanium (Ti), aluminum (Al), and titanium (Ti), but may not be limited thereto. For example, the first source electrode 122 and the first drain electrode 123 may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof.

A part of the first active layer 121 connected to each of the first source electrode 122 and the first drain electrode 123 may become conductive. For example, after the contact holes penetrating through the first gate insulating layer 112 and the first interlayer insulating layer 113 and exposing the first active layer 121 are formed, parts of the first active layer 121 exposed through the contact holes may become conductive. Further, the parts of the first active layer 121 exposed through the contact holes may become conductive through a thermal process. By performing a thermal process to the first active layer 121 through the contact holes, the parts of the first active layer 121 can be conductive with effect.

The separation insulating layer 114 may be disposed on the first interlayer insulating layer 113, the first source electrode 122, and the first drain electrode 123. The separation insulating layer 114 may include a contact hole for exposing at least a part of the first source electrode 122 and the first drain electrode 123. The separation insulating layer 114 may function to isolate the second thin film transistor 130 disposed on the separation insulating layer 114 from the first thin film transistor 120 disposed under the separation insulating layer 114. For example, the separation insulating layer 114 may be disposed on the first source electrode 122 and the first drain electrode 123 of the first thin film transistor 120 and the second thin film transistor 130 may be disposed on the separation insulating layer 114.

The separation insulating layer 114 may be formed as a single layer of silicon nitride (SiNx) or silicon oxide (SiOx) or a multi-layer of silicon nitride (SiNx) and silicon oxide (SiOx).

A second active layer 131 of the second thin film transistor 130 may be disposed on the separation insulating layer 114. The second thin film transistor 130 may include the second active layer 131, a second gate insulating layer 115, a second gate electrode 134, a second source electrode 132, and a second drain electrode 133.

The second active layer 131 may include a second channel region 131a in which a channel is formed when the second thin film transistor 130 is driven, and a second source region 131b and a second drain region 131c on both respective sides of the second channel region 131a. The second source region 131b refers to a part of the second active layer 131 connected to the second source electrode 132, and the second drain region 131c refers to a part of the second active layer 131 connected to the second drain electrode 133.

The second active layer 131 may be formed of an oxide semiconductor. An oxide semiconductor material has a higher band gap than a silicon material. Therefore, electrons cannot pass the band gap in an off state, and, thus, an off-current is low. Accordingly, a thin film transistor including an active layer formed of an oxide semiconductor may be suitable for a switching thin film transistor having a short on-time and a long off-time, but may not be limited thereto. The oxide semiconductor can be applied to a driving thin film transistor depending on characteristics of the display device. Further, the size of a storage capacitor can be reduced due to its low off-current. Therefore, the oxide semiconductor is suitable for a high-resolution display device. For example, the second active layer 131 may be formed of various metal oxides such as IGZO (indium-gallium-zinc-oxide). The second active layer 131 of the second thin film transistor 130 has been described based on the assumption that the second active layer 131 is formed of IGZO among various metal oxides, but may not be limited thereto. The second active layer 131 of the second thin film transistor 130 may be formed of other metal oxides such as IZO (indium-zinc-oxide), IGTO (indium-gallium-tin-oxide), or IGO (indium-gallium-oxide) instead of IGZO.

The second active layer 131 may be formed by depositing a metal oxide on the separation insulating layer 114, performing a thermal process for stabilization thereto, and patterning the metal oxide.

An insulating material layer and a metal material layer may be formed in sequence on the entire surface of the substrate including the second active layer 131, and a photoresist pattern may be formed on the metal material layer.

The insulating material layer may be formed using a PECVD method and the metal material layer may be formed using a sputtering method.

The second gate electrode 134 may be formed by performing wet etching to the metal material layer using a photoresist pattern PR as a mask. A material which selectively etches molybdenum (Mo), copper (Cu), titanium (Ti), aluminum (Al), chromium (Cr), gold (Au), nickel (Ni), and neodymium (Nd) or their alloys constituting the metal material layer and does not etch the insulating material layer may be used as a wet etching solution for etching the metal material layer.

The second gate insulating layer 115 may be formed by performing dry etching to the insulating material layer using the photoresist pattern PR and the second gate electrode 134 as a mask.

A pattern of the second gate insulating layer 115 may be formed on the second active layer 131 by etching the insulating material layer through the dry etching process. Further, a part of the second active layer 131 exposed through the patterned second gate insulating layer 115 may become conductive through the dry etching process.

The second active layer 131 may be formed including the non-conductive second channel region 131a corresponding to an area where the second gate electrode 134 is formed and the conductive second source region 131b and second drain region 131c on both ends of the second active layer 131.

The conductive second source region 131b and second drain region 131c of the second active layer 131 have a low resistance, and, thus, the performance of the second thin film transistor 130 can be improved. Therefore, the reliability of the display device 100 according to an embodiment of the present disclosure can be improved.

The second channel region 131a of the second active layer 131 may be disposed as overlapped with the second gate electrode 134. Further, the second source region 131b and the second drain region 131c of the second active layer 131 may be disposed on both respective sides of the second channel region 131a. Furthermore, the second gate insulating layer 115 may be disposed between the second gate electrode 134 and the second active layer 131. Also, the second gate insulating layer 115 may be disposed to be overlapped with the second gate electrode 134 and the second channel region 131a of the second active layer 131.

Since the insulating material layer and the metal material layer are etched using the photoresist pattern PR as a mask, the second gate insulating layer 115 and the second gate electrode 134 may be formed into the same pattern. The second gate insulating layer 115 may be disposed on the second active layer 131. The second gate insulating layer 115 may be formed as a single layer of silicon nitride (SiNx) or silicon oxide (SiOx) or a multi-layer of silicon nitride (SiNx) and silicon oxide (SiOx). The second gate insulating layer 115 may be patterned to be overlapped with the second channel region 131a of the second active layer 131. The second gate electrode 134 may be disposed on the second gate insulating layer 115. The second gate electrode 134 may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof. The second gate electrode 134 may be patterned to be overlapped with the second active layer 131 and the second gate insulating layer 115. The second gate electrode 134 may be patterned to be overlapped with the second channel region 131a of the second active layer 131. Further, the second gate insulating layer 115 may be patterned to be overlapped with the second channel region 131a of the second active layer 131. Therefore, the second gate electrode 134 and the second gate insulating layer 115 may be overlapped with the second channel region 131a of the second active layer 131.

The second interlayer insulating layer 116 may be disposed on the separation insulating layer 114, the second active layer 131, and the second gate electrode 134. The second interlayer insulating layer 116 may include contact holes for exposing the first drain electrode 123 of the first thin film transistor 120 and the second active layer 131 of the second thin film transistor 130. For example, the second interlayer insulating layer 116 may include a contact hole for exposing the first drain electrode 123 of the first thin film transistor 120 and contact holes for exposing the second source region 131b and the second drain region 131c of the second active layer 131 of the second thin film transistor 130. The second interlayer insulating layer 116 may further include a contact hole for exposing the first source electrode 122 of the first thin film transistor 120.

The second interlayer insulating layer 116 may be formed as a single layer of silicon nitride (SiNx) or silicon oxide (SiOx) or a multi-layer of silicon nitride (SiNx) and silicon oxide (SiOx).

The connecting electrode 140, the second source electrode 132, and the second drain electrode 133 may be disposed on the second interlayer insulating layer 116.

The connecting electrode 140 may be electrically connected to the first drain electrode 123 through the contact holes formed in the separation insulating layer 114 and the second interlayer insulating layer 116, but may not be limited thereto. For example, the connecting electrode 140 may be electrically connected to the first source electrode 122 through the contact holes formed in the separation insulating layer 114 and the second interlayer insulating layer 116. Further, when the connecting electrode 140 is formed to be electrically connected to the first drain electrode 123 through the contact holes formed in the separation insulating layer 114 and the second interlayer insulating layer 116, a first auxiliary source electrode electrically connected to the first source electrode 122 through the contact holes formed in the separation insulating layer 114 and the second interlayer insulating layer 116 may be further formed.

Further, the second source electrode 132 and the second drain electrode 133 of the second thin film transistor 130 may be connected to the second active layer 131 through the contact holes formed in the second interlayer insulating layer 116. Therefore, the second source electrode 132 of the second thin film transistor 130 may be connected to the second source region 131b of the second active layer 131 through the contact hole formed in the second interlayer insulating layer 116. Further, the second drain electrode 133 of the second thin film transistor 130 may be connected to the second drain region 131c of the second active layer 131 through the contact hole formed in the second interlayer insulating layer 116.

The connecting electrode 140, the second source electrode 132, and the second drain electrode 133 may be formed by the same process. Further, the connecting electrode 140, the second source electrode 132, and the second drain electrode 133 may be formed of the same material. The connecting electrode 140, the second source electrode 132, and the second drain electrode 133 may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof. The first thin film transistor 120 may be disposed under the separation insulating layer 114, and the second thin film transistor 130 may be disposed on the separation insulating layer 114. Further, the first thin film transistor 120 and the second thin film transistor 130 can be isolated from each other by the separation insulating layer 114. The connecting electrode 140 may be electrically connected to the first drain electrode 123 of the first thin film transistor 120 and may also be electrically connected to the second source electrode 132 of the second thin film transistor 130. The first drain electrode 123 of the first thin film transistor 120 may be electrically connected to the second source electrode 132 of the second thin film transistor 130 through the connecting electrode 140.

In the display device 100 according to an embodiment of the present disclosure, the first thin film transistor 120 is formed and then the separation insulating layer 114 is formed on the first thin film transistor 120. Then, the second thin film transistor 130 is formed on the separation insulating layer 114. Therefore, damage to parts of the second active layer 131 connected to the second source electrode 132 and the second drain electrode 133 can be reduced.

The first drain electrode 123 and the connecting electrode 140 may be formed as a single source electrode or drain electrode to be connected with the first active layer 121 through the contact hole penetrating through all of the first gate insulating layer 112, the first interlayer insulating layer 113, the separation insulating layer 114, and the second interlayer insulating layer 116. In this situation, the contact hole penetrating through all of the first gate insulating layer 112, the first interlayer insulating layer 113, the separation insulating layer 114, and the second interlayer insulating layer 116 and exposing the first active layer 121 and the contact hole penetrating through the second interlayer insulating layer 116 and exposing the second active layer 131 may be formed by the same process. As such, the first source electrode 122, the first drain electrode 123, the second source electrode 132, and the second drain electrode 133 may be formed by the same process. For example, the source electrodes and the drain electrodes of the first thin film transistor 120 and the second thin film transistor 130 may be formed together by the same process after the second interlayer insulating layer 116 is formed.

Further, the contact hole penetrating through all of the first gate insulating layer 112, the first interlayer insulating layer 113, the separation insulating layer 114, and the second interlayer insulating layer 116 and exposing the first active layer 121 and the contact hole penetrating through the second interlayer insulating layer 116 and exposing the second active layer 131 may be formed through dry etching.

To form the contact hole penetrating through all of the first gate insulating layer 112, the first interlayer insulating layer 113, the separation insulating layer 114, and the second interlayer insulating layer 116 and exposing the first active layer 121, all of the first gate insulating layer 112, the first interlayer insulating layer 113, the separation insulating layer 114, and the second interlayer insulating layer 116 should to be etched. Further, to form the contact hole penetrating through the second interlayer insulating layer 116 and exposing the second active layer 131, the second interlayer insulating layer 116 should to be etched. Therefore, a plurality of layers can be etched to form the contact hole penetrating through all of the first gate insulating layer 112, the first interlayer insulating layer 113, the separation insulating layer 114, and the second interlayer insulating layer 116 and exposing the first active layer 121 together with the contact hole penetrating through the second interlayer insulating layer 116 and exposing the second active layer 131. A wet etching method may not be suitable to sufficiently etch the plurality of layers, and, thus, a dry etching method may be used to etch the plurality of layers.

The contact hole penetrating through all of the first gate insulating layer 112, the first interlayer insulating layer 113, the separation insulating layer 114, and the second interlayer insulating layer 116 and exposing the first active layer 121 further penetrates through the separation insulating layer 114, the first interlayer insulating layer 113, and the first gate insulating layer 112 compared with the contact hole penetrating through the second interlayer insulating layer 116 and exposing the second active layer 131.

Therefore, when the contact hole penetrating through all of the first gate insulating layer 112, the first interlayer insulating layer 113, the separation insulating layer 114, and the second interlayer insulating layer 116 and exposing the first active layer 121 and the contact hole penetrating through the second interlayer insulating layer 116 and exposing the second active layer 131 are formed simultaneously through dry etching, the second source region 131b and the second drain region 131c of the second active layer 131 connected to the second source electrode 132 and the second drain electrode 133 may be damaged. For example, a part of the second source region 131b and the second drain region 131c of the second active layer 131 may be removed during dry etching. Otherwise, the surface of the second source region 131b and the second drain region 131c of the second active layer 131 may be physically defective. Therefore, the characteristics of the device may be degraded and the reliability of the second thin film transistor 130 may be decreased.

Accordingly, in the display device 100 according to an embodiment of the present disclosure, the first source electrode 122 and the connecting electrode 140 are not formed as a single source electrode and the first drain electrode 123 and the connecting electrode 140 are not formed as a single drain electrode. The first source electrode 122 and the first drain electrode 123 may be formed separately from the connecting electrode 140. For example, the first thin film transistor 120 and the second thin film transistor 130 may be formed as separate layers. After the first source electrode 122 and the first drain electrode 123 of the first thin film transistor 120 are formed, the contact hole penetrating through the separation insulating layer 114 and the second interlayer insulating layer 116 and exposing the first active layer 121 may be formed. Then, the contact hole penetrating through the second interlayer insulating layer 116 and exposing the second active layer 131 may be formed. Since the first source electrode 122 and the first drain electrode 123 are formed separately from the connecting electrode 140, damage to the second source region 131b and the second drain region 131c of the second active layer 131 connected to the second source electrode 132 and the second drain electrode 133 can be reduced. Since damage to the second source region 131b and the second drain region 131c of the second active layer 131 connected to the second source electrode 132 and the second drain electrode 133 is reduced, the performance of the second thin film transistor 130 can be improved. Therefore, the reliability of the display device 100 according to an embodiment of the present disclosure can be improved.

The passivation layer 117 may be disposed on the second source electrode 132, the second drain electrode 133, the connecting electrode 140, and the second interlayer insulating layer 116. As illustrated in FIG. 1, the passivation layer 117 may include a contact hole for exposing the second drain electrode 133, but may not be limited thereto. For example, the passivation layer 117 may include a contact hole for exposing the second source electrode 132 of the second thin film transistor 130. Otherwise, the passivation layer 117 may include a contact hole for exposing the connecting electrode 140 electrically connected to the first drain electrode 123 of the first thin film transistor 120. The passivation layer 117 may be an inorganic material layer configured to protect upper parts of the first thin film transistor 120 and the second thin film transistor 130. For example, the passivation layer 117 may be formed as a single layer of silicon nitride (SiNx) or silicon oxide (SiOx) or a multi-layer of silicon nitride (SiNx) and silicon oxide (SiOx). The passivation layer 117 can block hydrogen diffused from the upper parts of the first thin film transistor 120 and the second thin film transistor 130. The passivation layer 117 may be omitted based on the characteristics of the display device or the structure and characteristics of the thin film transistor according to an embodiment of the present disclosure.

The first auxiliary electrode 170 may be disposed on the passivation layer 117. Further, the first auxiliary electrode 170 may be connected to the second drain electrode 133 of the second thin film transistor 130 through the contact hole in the passivation layer 117. The first auxiliary electrode 170 may function to electrically connect the second thin film transistor 130 with the first electrode 150. The first auxiliary electrode 170 may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof.

The planarization layer 118 may be disposed on the first auxiliary electrode 170 and the passivation layer 117. Further, as illustrated in FIG. 1, the planarization layer 118 may include a contact hole for exposing the first auxiliary electrode 170. The planarization layer 118 may be an organic material layer configured to flatten the upper parts of the first thin film transistor 120 and the second thin film transistor 130. For example, the planarization layer 118 may be formed of an organic material such as acryl resin, epoxy resin, phenolic resin, polyamide resin, polyimide resin, and the like.

The first electrode 150 may be disposed on the planarization layer 118. The first electrode 150 may be electrically connected to the first auxiliary electrode 170 through the contact hole formed in the planarization layer 118. Since the first electrode 150 is connected to the first auxiliary electrode 170 through the contact hole formed in the planarization layer 118, the first electrode 150 can be electrically connected to the second thin film transistor 130.

The display device 100 according to an embodiment of the present disclosure is a top-emission display device. Therefore, the first electrode 150 may be an anode electrode. When the display device 100 is a bottom-emission display device, the first electrode 150 disposed on the planarization layer 118 may be a cathode electrode.

The bank 160 may be disposed on the first electrode 150 and the planarization layer 118. The bank 160 may include an opening for exposing the first electrode 150. The bank 160 can define an emission area of the display device 100 and thus can be referred to as a pixel defining layer.

An emission structure including an emission layer may be further disposed on the first electrode 150 and the bank 160. A second electrode may be further disposed on the emission structure. In the display device 100 according to an embodiment of the present disclosure, the second electrode may be a cathode electrode. An encapsulation unit configured to suppress moisture penetration may be further disposed on the second electrode.

Figure 2:
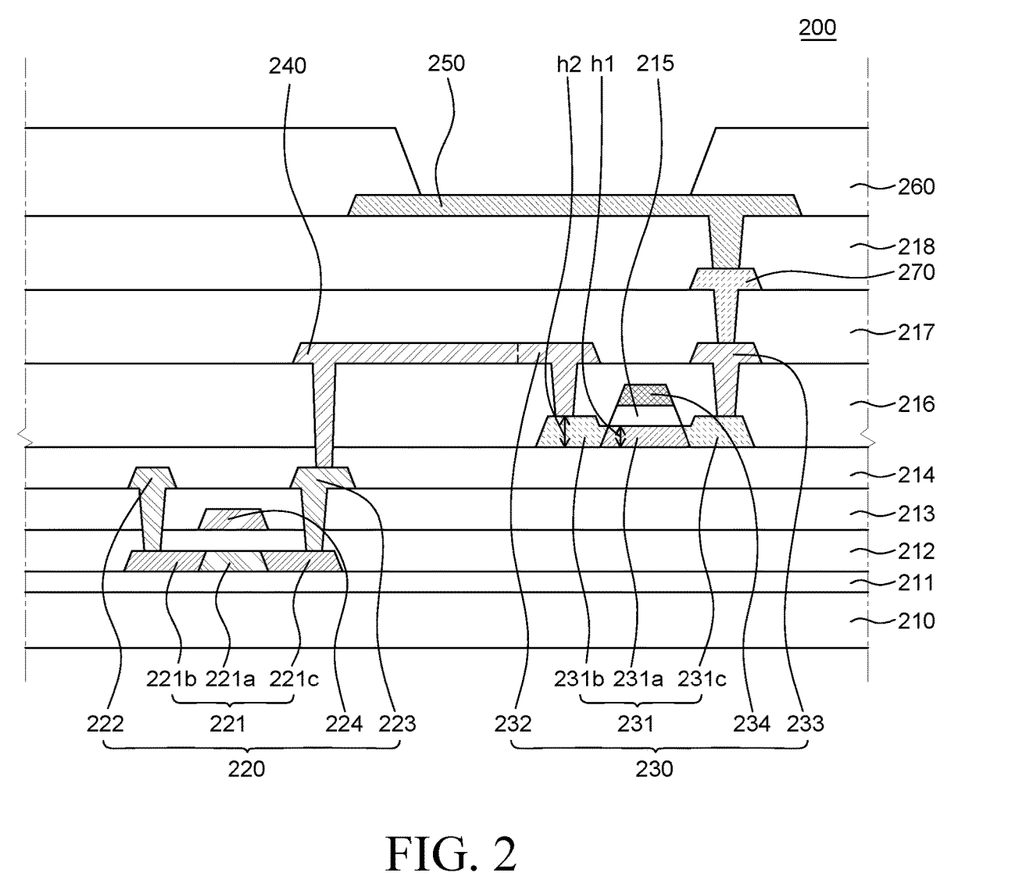
FIG. 2 is a cross-sectional view illustrating a display device according to another embodiment of the present disclosure.

FIG. 2 is a cross-sectional view illustrating a display device 200 according to another embodiment of the present disclosure. FIG. 1 will also be referred to hereinafter, and the redundant description will be omitted or briefly provided. For example, a first thin film transistor 220 illustrated in FIG. 2 is substantially the same as the first thin film transistor 120 illustrated in FIG. 1. Therefore, the redundant description of components illustrated in FIG. 2 which are substantially the same as those illustrated in FIG. 1 will be omitted or briefly provided.

Referring to FIG. 2, the display device 200 according to another embodiment of the present disclosure may include a substrate 210, a buffer layer 211, a first thin film transistor 220, and a second thin film transistor 230. The display device 200 may further include a first gate insulating layer 212, a first interlayer insulating layer 213, a separation insulating layer 214, a second gate insulating layer 215, and a second interlayer insulating layer 216. The display device 200 may further include a passivation layer 217, a planarization layer 218, a connecting electrode 240, a bank 260, a first auxiliary electrode 270, and a first electrode 250. Further, a first active layer 221 of the first thin film transistor 220 may be formed of LTPS, and a second active layer 231 of the second thin film transistor 230 may be formed of an oxide semiconductor.

The first thin film transistor 220 may include the first active layer 221, a first source electrode 222, a first drain electrode 223, and a first gate electrode 224. Further, the first active layer 221 may include a first channel region 221a, a first source region 221b, and a first drain region 221c.

Furthermore, the second thin film transistor 230 may include the second active layer 231, a second source electrode 232, a second drain electrode 233, and a second gate electrode 234. Also, the second active layer 231 may include a second channel region 231a, a second source region 231b, and a second drain region 231c.

When the second active layer 231 is formed to a small thickness, the reliability of the device can be improved. Further, the second active layer 231 may be connected to the second source electrode 232 and the second drain electrode 233 through contact holes. Since the second active layer 231 has a small thickness, the second active layer 231 may be lost when the contact holes are formed, and, thus, the device is degraded. Accordingly, the inventors of the present disclosure conducted various experiments for reducing the loss of the second active layer 231 occurring when contact holes are formed in the second active layer 231. The inventors of the present disclosure invented a new display device in which the second active layer 231 has different thicknesses between a part where a contact hole is formed and a part where a contact hole is not formed, through the experiments. Details thereof will be described below. Referring to FIG. 2, in the display device 200 according to another embodiment of the present disclosure, the second active layer 231 of the second thin film transistor 230 may have a first thickness h1 and a second thickness h2 different from the first thickness h1. The second channel region 231a of the second active layer 231 may have the first thickness h1. Further, the second source region 231b and the second drain region 231c of the second active layer 231 may have the second thickness h2.

The second thickness h2 may be greater than the first thickness h1 (e.g., h2>h1). Therefore, the second source region 231b and the second drain region 231c of the second active layer 231 may be formed to be thicker than the second channel region 231a of the second active layer 231.

The second channel region 231a of the second active layer 231 may be disposed as overlapped with the second gate electrode 234. Further, the second source region 231b and the second drain region 231c of the second active layer 231 may be disposed on both respective sides of the second channel region 231a. Further, the second gate insulating layer 215 may be disposed between the second gate electrode 234 and the second active layer 231. Furthermore, the second gate insulating layer 215 may be disposed to be overlapped with the second gate electrode 234 and the second channel region 231a of the second active layer 231.

In the second active layer 231, an area overlapped with the second gate electrode 234 may have the first thickness h1 and an area not overlapped with the second gate electrode 234 may have the second thickness h2 different from the first thickness h1. The second thickness h2 may be greater than the first thickness h1.

In the second active layer 231, an area overlapped with the second gate insulating layer 215 may have the first thickness h1 and an area not overlapped with the second gate insulating layer 215 may have the second thickness h2 different from the first thickness h1. The second thickness h2 may be greater than the first thickness h1. In the second active layer 231, an area overlapped with the second gate electrode 234 and the second gate insulating layer 215 may have the first thickness h1 and an area not overlapped with the second gate electrode 234 and the second gate insulating layer 215 may have the second thickness h2 different from the first thickness h1. The second thickness h2 may be greater than the first thickness h1. The second gate electrode 234 and the second gate insulating layer 215 may be overlapped with each other.

The second channel region 231a of the second active layer 231 may be overlapped with the second gate insulating layer 215. Further, the second channel region 231a of the second active layer 231 overlapped with the second gate insulating layer 215 may have the first thickness h1. Furthermore, the second source region 231b and the second drain region 231c of the second active layer 231 not overlapped with the second gate insulating layer 215 may have the second thickness h2 different from the first thickness h1. The second thickness h2 may be greater than the first thickness h1.

The second channel region 231a of the second active layer 231 may be overlapped with the second gate electrode 234. Further, the second channel region 231a of the second active layer 231 overlapped with the second gate electrode 234 may have the first thickness h1. Further, the second source region 231b and the second drain region 231c of the second active layer 231 not overlapped with the second gate electrode 234 may have the second thickness h2 different from the first thickness h1. The second thickness h2 may be greater than the first thickness h1.

The second channel region 231a of the second active layer 231 may be overlapped with the second gate electrode 234 and the second gate insulating layer 215. Further, the second channel region 231a of the second active layer 231 overlapped with the second gate electrode 234 and the second gate insulating layer 215 may have the first thickness h1. Further, the second source region 231b and the second drain region 231c of the second active layer 231 not overlapped with the second gate electrode 234 and the second gate insulating layer 215 may have the second thickness h2 different from the first thickness h1. The second thickness h2 may be greater than the first thickness h1. The second gate electrode 234 and the second gate insulating layer 215 may be overlapped with each other.

The second interlayer insulating layer 216 may be disposed on the separation insulating layer 214, the second active layer 231, and the second gate electrode 234. Further, the second interlayer insulating layer 216 may include contact holes for exposing the first drain electrode 223 of the first thin film transistor 220 and the second active layer 231 of the second thin film transistor 230. For example, as illustrated in FIG. 2, the second interlayer insulating layer 216 may include a contact hole for exposing the first drain electrode 223 of the first thin film transistor 220 and contact holes for exposing the second source region 231b and the second drain region 231c of the second active layer 231 of the second thin film transistor 230.

Further, the second source electrode 232 and the second drain electrode 233 of the second thin film transistor 230 may be connected to the second active layer 231 through the contact holes formed in the second interlayer insulating layer 216. Therefore, the second source electrode 232 of the second thin film transistor 230 may be connected to the second source region 231b of the second active layer 231 through the contact hole formed in the second interlayer insulating layer 216. Further, the second drain electrode 233 of the second thin film transistor 230 may be connected to the second drain region 231c of the second active layer 231 through the contact hole formed in the second interlayer insulating layer 216.

The connecting electrode 240 may be electrically connected to the first drain electrode 223 of the first thin film transistor 220 through the contact holes formed in the separation insulating layer 214 and the second interlayer insulating layer 216. Further, the connecting electrode 240 may function to electrically connect the first drain electrode 223 of the first thin film transistor 220 with the second source electrode 232 of the second thin film transistor 230. Also, the connecting electrode 240 may be formed of the same material on the same layer by the same process as the second source electrode 232 of the second thin film transistor 230. Furthermore, the connecting electrode 240 may be configured as one body with the second source electrode 232 of the second thin film transistor 230.

When contact holes penetrating through the second interlayer insulating layer 216 are formed to expose the second source region 231b and the second drain region 231c of the second active layer 231, the second source region 231b and the second drain region 231c of the second active layer 231 may be lost or damaged.

Therefore, in the display device 200 according to another embodiment of the present disclosure, the second source region 231b and the second drain region 231c of the second active layer 231 of the second thin film transistor 230 are formed to be thicker than the second channel region 231a of the second active layer 231. Thus, it is possible to suppress the loss of the second source region 231b and the second drain region 231c. Therefore, the reliability of the display device 200 according to another embodiment of the present disclosure can be improved.

Figure 3:
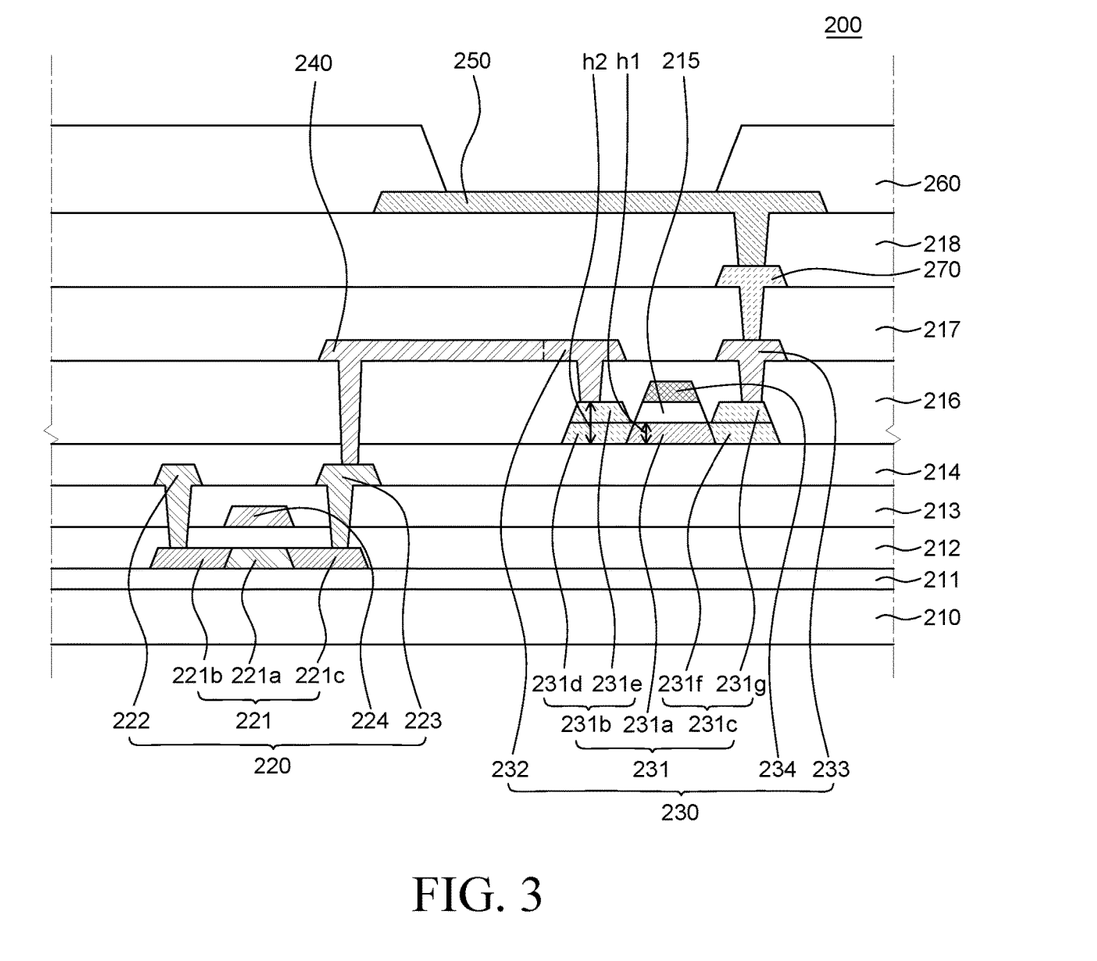
FIG. 3 is a cross-sectional view illustrating the display device according to another embodiment of the present disclosure.

FIG. 3 is a cross-sectional view illustrating the display device 200 according to another embodiment of the present disclosure.

FIG. 1 will also be referred to hereinafter, and the redundant description will be omitted or briefly provided. For example, the first thin film transistor 220 illustrated in FIG. 3 is substantially the same as the first thin film transistor 120 illustrated in FIG. 1. Therefore, the redundant description of components illustrated in FIG. 3 which are substantially the same as those illustrated in FIG. 1 will be omitted or briefly provided.

Referring to FIG. 3, the display device 200 according to another embodiment of the present disclosure may include the substrate 210, the buffer layer 211, the first thin film transistor 220, and the second thin film transistor 230. The display device 200 may further include the first gate insulating layer 212, the first interlayer insulating layer 213, the separation insulating layer 214, the second gate insulating layer 215, and the second interlayer insulating layer 216. The display device 200 may further include the passivation layer 217, the planarization layer 218, the bank 260, the connecting electrode 240, the first auxiliary electrode 270, and the first electrode 250. Further, the first active layer 221 of the first thin film transistor 220 may be formed of LTPS, and the second active layer 231 of the second thin film transistor 230 may be formed of an oxide semiconductor.

The first thin film transistor 220 may include the first active layer 221, the first source electrode 222, the first drain electrode 223, and the first gate electrode 224. Further, the first active layer 221 may include the first channel region 221a, the first source region 221b, and the first drain region 221c.

Furthermore, the second thin film transistor 230 may include the second active layer 231, the second source electrode 232, the second drain electrode 233, and the second gate electrode 234. Also, the second active layer 231 may include the second channel region 231a, the second source region 231b, and the second drain region 231c.

The second channel region 231a of the second active layer 231 may be disposed as overlapped with the second gate electrode 234. Further, the second source region 231b and the second drain region 231c of the second active layer 231 may be disposed on both respective sides of the second channel region 231a. Further, the second gate insulating layer 215 may be disposed between the second gate electrode 234 and the second active layer 231. Furthermore, the second gate insulating layer 215 may be disposed to be overlapped with the second gate electrode 234 and the second channel region 231a of the second active layer 231.

In the display device 200 according to another embodiment of the present disclosure, the second active layer 231 of the second thin film transistor 230 may be formed as at least two layers.

The second channel region 231a of the second active layer 231 may be formed as a single layer. Further, the second source region 231b and the second drain region 231c of the second active layer 231 may be formed as a plurality of layers. For example, as illustrated in FIG. 3, the second source region 231b of the second active layer 231 may be formed as a plurality of layers including a second source region lower layer 231d and a second source region upper layer 231e disposed on the second source region lower layer 231d. Further, the second drain region 231c of the second active layer 231 may be formed as a plurality of layers including a second drain region lower layer 231f and a second drain region upper layer 231g disposed on the second drain region lower layer 231f.

The second source region lower layer 231d of the second source region 231b and the second drain region lower layer 231f of the second drain region 231c may be formed of the same semiconductor material on the same layer as the second channel region 231a. Further, the second source region upper layer 231e and the second drain region upper layer 231g may be formed of a different material from the second source region lower layer 231d and the second drain region lower layer 231f. The second source region upper layer 231e and the second drain region upper layer 231g may be formed of a metal material. For example, the second source region upper layer 231e and the second drain region upper layer 231g may be formed as a single layer or a multi-layer using any one of molybdenum (Mo), copper (Cu), titanium (Ti), aluminum (Al), chromium (Cr), gold (Au), nickel (Ni), and neodymium (Nd) or alloys thereof.

The second active layer 231 of the second thin film transistor 230 may have a first thickness h1 and a second thickness h2 different from the first thickness h1. The second channel region 231a of the second active layer 231 may have the first thickness h1. Further, the second source region 231b and the second drain region 231c of the second active layer 231 may have the second thickness h2.

The second thickness h2 may be greater than the first thickness h1. Therefore, the second source region 231b and the second drain region 231c of the second active layer 231 may be formed to be thicker than the second channel region 231a of the second active layer 231.

In the second thin film transistor 230, an area of the second active layer 231 overlapped with the second gate electrode 234 may be formed as a single layer having the first thickness h1. Further, an area of the second active layer 231 not overlapped with the second gate electrode 234 may have the second thickness h2 greater than the first thickness h1 and may be formed as a plurality of layers. For example, the area of the second active layer 231 not overlapped with the second gate electrode 234 may be formed as a plurality of layers including a lower layer and an upper layer disposed on the lower layer. Further, the area of the second active layer 231 formed as a single layer and overlapped with the second gate electrode 234 may be formed of a semiconductor material. Furthermore, the lower layer in the area of the second active layer 231 not overlapped with the second gate electrode 234 may be formed of the same semiconductor material as the single layer in the area of the second active layer 231 overlapped with the second gate electrode 234. Also, the upper layer in the area of the second active layer 231 not overlapped with the second gate electrode 234 may be formed of a different material from the lower layer. For example, the area of the second active layer 231 overlapped with the second gate electrode 234 and the lower layer in the area of the second active layer 231 not overlapped with the second gate electrode 234 may be oxide semiconductor material layers. Further, the upper layer in the area of the second active layer 231 not overlapped with the second gate electrode 234 may be a metal material layer.

In the second thin film transistor 230, an area of the second active layer 231 overlapped with the second gate insulating layer 215 may be formed as a single layer having the first thickness h1. Further, an area of the second active layer 231 not overlapped with the second gate insulating layer 215 may have the second thickness h2 greater than the first thickness h1 and may be formed as a plurality of layers. For example, the area of the second active layer 231 not overlapped with the second gate insulating layer 215 may be formed as a plurality of layers including a lower layer and an upper layer disposed on the lower layer. Further, the area of the second active layer 231 formed as a single layer and overlapped with the second gate insulating layer 215 may be formed of a semiconductor material. Furthermore, the lower layer in the area of the second active layer 231 not overlapped with the second gate insulating layer 215 may be formed of the same semiconductor material as the single layer in the area of the second active layer 231 overlapped with the second gate insulating layer 215. For example, the area of the second active layer 231 overlapped with the second gate insulating layer 215 and the lower layer in the area of the second active layer 231 not overlapped with the second gate insulating layer 215 may be oxide semiconductor material layers. Further, the upper layer in the area of the second active layer 231 not overlapped with the second gate insulating layer 215 may be a metal material layer. In the second thin film transistor 230, an area of the second active layer 231 overlapped with the second gate electrode 234 and the second gate insulating layer 215 may be formed as a single layer having the first thickness h1. Further, an area of the second active layer 231 not overlapped with the second gate electrode 234 and the second gate insulating layer 215 may have the second thickness h2 greater than the first thickness h1 and may be formed as a plurality of layers. Furthermore, the area of the second active layer 231 formed as a single layer and overlapped with the second gate electrode 234 may be formed of a semiconductor material. Also, a lower layer in the area of the second active layer 231 not overlapped with the second gate electrode 234 may be formed of the same semiconductor material as the single layer in the area of the second active layer 231 overlapped with the second gate electrode 234. An upper layer in the area of the second active layer 231 not overlapped with the second gate electrode 234 may be formed of a different material from the lower layer. For example, the single layer in the area of the second active layer 231 overlapped with the second gate electrode 234 and the lower layer in the area of the second active layer 231 not overlapped with the second gate electrode 234 may be oxide semiconductor material layers. Further, the upper layer in the area of the second active layer 231 not overlapped with the second gate electrode 234 may be a metal material layer. The second channel region 231a of the second active layer 231 may be overlapped with the second gate insulating layer 215. Further, the second channel region 231a of the second active layer 231 overlapped with the second gate insulating layer 215 may have the first thickness h1 and may be formed as a single layer. Further, the second source region 231b and the second drain region 231c of the second active layer 231 not overlapped with the second gate insulating layer 215 may have the second thickness h2 greater than the first thickness h1 and may be formed as a plurality of layers. For example, the second source region 231b of the second active layer 231 not overlapped with the second gate insulating layer 215 may be formed as a plurality of layers including the second source region lower layer 231d and the second source region upper layer 231e disposed on the second source region lower layer 231d. Further, the second drain region 231c of the second active layer 231 not overlapped with the second gate insulating layer 215 may be formed as a plurality of layers including the second drain region lower layer 231f and the second drain region upper layer 231g disposed on the second drain region lower layer 231f. Furthermore, the second source region lower layer 231d and the second drain region lower layer 231f may be formed of the same semiconductor material as the second channel region 231a. The second source region upper layer 231e and the second drain region upper layer 231g may be formed of a different material from the second source region lower layer 231d and the second drain region lower layer 231f. The second source region upper layer 231e and the second drain region upper layer 231g may be formed of a metal material.

The second channel region 231a of the second active layer 231 may be overlapped with the second gate electrode 234. Further, the second channel region 231a of the second active layer 231 overlapped with the second gate electrode 234 may have the first thickness h1 and may be formed as a single layer. Further, the second source region 231b and the second drain region 231c of the second active layer 231 not overlapped with the second gate electrode 234 may have the second thickness h2 greater than the first thickness h1 and may be formed as a plurality of layers. For example, the second source region 231b of the second active layer 231 not overlapped with the second gate electrode 234 may be formed as a plurality of layers including the second source region lower layer 231d and the second source region upper layer 231e disposed on the second source region lower layer 231d. Further, the second drain region 231c may be formed as a plurality of layers including the second drain region lower layer 231f and the second drain region upper layer 231g disposed on the second drain region lower layer 231f. Furthermore, the second source region lower layer 231d and the second drain region lower layer 231f may be formed of the same semiconductor material as the second channel region 231a. The second source region upper layer 231e and the second drain region upper layer 231g may be formed of a different material from the second source region lower layer 231d and the second drain region lower layer 231f The second source region upper layer 231e and the second drain region upper layer 231g may be formed of a metal material.

The second channel region 231a of the second active layer 231 may be overlapped with the second gate electrode 234 and the second gate insulating layer 215. Further, the second gate electrode 234 and the second gate insulating layer 215 may be overlapped with each other. The second channel region 231a of the second active layer 231 overlapped with the second gate electrode 234 and the second gate insulating layer 215 may have the first thickness h1 and may be formed as a single layer. The second source region 231b and the second drain region 231c of the second active layer 231 not overlapped with the second gate electrode 234 and the second gate insulating layer 215 may have the second thickness h2 greater than the first thickness h1 and may be formed as a plurality of layers. For example, the second source region 231b of the second active layer 231 not overlapped with the second gate electrode 234 and the second gate insulating layer 215 may be formed as a plurality of layers including the second source region lower layer 231$d$ and the second source region upper layer 231$e$ disposed on the second source region lower layer 231$d$. Further, the second drain region 231$c$ of the second active layer 231 not overlapped with the second gate electrode 234 and the second gate insulating layer 215 may be formed as a plurality of layers including the second drain region lower layer 231$f$ and the second drain region upper layer 231$g$ disposed on the second drain region lower layer 231$f$. Furthermore, the second source region lower layer 231$d$ and the second drain region lower layer 231$f$ may be formed of the same semiconductor material as the second channel region 231$a$. The second source region upper layer 231$e$ and the second drain region upper layer 231$g$ may be formed of a different material from the second source region lower layer 231$d$ and the second drain region lower layer 231$f$. The second source region upper layer 231$e$ and the second drain region upper layer 231$g$ may be formed of a metal material.

The second interlayer insulating layer 216 may be disposed on the separation insulating layer 214, the second active layer 231, and the second gate electrode 234. Further, the second interlayer insulating layer 216 may include contact holes for exposing the first drain electrode 223 of the first thin film transistor 220 and the second active layer 231 of the second thin film transistor 230. For example, as illustrated in FIG. 3, the second interlayer insulating layer 216 may include a contact hole for exposing the first drain electrode 223 of the first thin film transistor 220 and contact holes for exposing the second source region 231$b$ and the second drain region 231$c$ of the second active layer 231 of the second thin film transistor 230. The second source region lower layer 231$d$ of the second source region 231$b$ and the second drain region lower layer 231$f$ of the second drain region 231$c$ may be exposed through the contact holes in the second interlayer insulating layer 216. For example, in an etching process for forming the contact holes penetrating through the second interlayer insulating layer 216, the second source region upper layer 231$e$ and the second drain region upper layer 231$g$ may also be removed together. Further, the second source region lower layer 231$d$ of the second source region 231$b$ and the second drain region lower layer 231$f$ of the second drain region 231$c$ may be exposed through the contact holes.

Further, the second source electrode 232 and the second drain electrode 233 of the second thin film transistor 230 may be connected to the second active layer 231 through the contact holes formed in the second interlayer insulating layer 216. Therefore, the second source electrode 232 of the second thin film transistor 230 may be connected to the second source region 231$b$ of the second active layer 231 through the contact hole formed in the second interlayer insulating layer 216. Further, the second drain electrode 233 of the second thin film transistor 230 may be connected to the second drain region 231$c$ of the second active layer 231 through the contact hole formed in the second interlayer insulating layer 216. Referring to FIG. 3, the second source electrode 232 of the second thin film transistor 230 may be connected to the second source region lower layer 231$d$ of the second source region 231$b$ by contact through the contact hole formed in the second interlayer insulating layer 216. Further, the second drain electrode 233 of the second thin film transistor 230 may be connected to the second drain region lower layer 231$f$ of the second drain region 231$c$ by contact through the contact hole formed in the second interlayer insulating layer 216.

The connecting electrode 240 may be electrically connected to the first drain electrode 223 of the first thin film transistor 220 through the contact holes formed in the separation insulating layer 214 and the second interlayer insulating layer 216. Further, the connecting electrode 240 may function to electrically connect the first drain electrode 223 of the first thin film transistor 220 with the second source electrode 232 of the second thin film transistor 230. Also, the connecting electrode 240 may be formed of the same material on the same layer by the same process as the second source electrode 232 of the second thin film transistor 230. Furthermore, the connecting electrode 240 may be configured as one body with the second source electrode 232 of the second thin film transistor 230.

When contact holes penetrating through the second interlayer insulating layer 216 are formed to expose the second source region 231$b$ and the second drain region 231$c$ of the second active layer 231, the second source region 231$b$ and the second drain region 231$c$ of the second active layer 231 may be lost or damaged.

Therefore, in the display device 200 according to another embodiment of the present disclosure, the second source region 231$b$ and the second drain region 231$c$ of the second active layer 231 of the second thin film transistor 230 are formed as a plurality of layers. Thus, it is possible to suppress the loss of the second source region 231$b$ and the second drain region 231$c$. For example, the second source region 231$b$ is formed as a plurality of layers including the second source region lower layer 231$d$ and the second source region upper layer 231$e$ disposed on the second source region lower layer 231$d$. Further, the second drain region 231$c$ is formed as a plurality of layers including the second drain region lower layer 231$f$ and the second drain region upper layer 231$g$ disposed on the second drain region lower layer 231$f$. Thus, it is possible to suppress the loss of the second source region lower layer 231$d$ and the second drain region lower layer 231$f$. In the process of forming the contact holes penetrating through the second interlayer insulating layer 216 and exposing the second source region 231$b$ and the second drain region 231$c$ of the second active layer 231, the second source region upper layer 231$e$ and the second drain region upper layer 231$g$ of the second source region 231$b$ and the second drain region 231$c$ may function as passivation layers for suppressing the loss of the second source region lower layer 231$d$ and the second drain region lower layer 231$f$ which are formed of the same semiconductor material as the second channel region 231$a$.

Therefore, the reliability of the display device 200 according to another embodiment of the present disclosure can be improved.

The embodiments of the present disclosure can also be described as follows below.

According to an aspect of the present disclosure, there is provided a foldable display device. The foldable display device includes a substrate including a folding area having a folding axis and a non-folding area, an insulating layer covering a part of an electrode electrically connected to a thin film transistor positioned on the substrate, and an organic emission layer positioned on the electrode. The foldable display device further includes a first column (or row) which is positioned on the insulating layer and in which a plurality of first spacers having a first width in the same direction as an extension direction of the folding axis is spaced apart from each other with a specific distance in a first direction and a second column (or row) which is positioned on the insulating layer and in which a plurality of second spacers having a third width longer than the first width in the same direction as the extension direction of the folding axis is spaced apart from each other with a specific distance in the first direction. The first column and the second column may have a crack suppressing array structure disposed in the folding area.

The crack suppressing array structure may be configured to minimize the elongation of the first spacers and the second spacers in a second direction perpendicular to the first direction when the substrate is folded around the folding axis.

The first width may be longer in length than other widths of the first spacer, and the third width may be longer in length than other widths of the second spacer.

The second spacer may have a greater area size than the first spacer.

The foldable display device further includes a third column identical to the first column and a fourth column identical to the second column. The first column and the third column may be disposed adjacent to each other and between the second column and the fourth column.

The foldable display device further includes a fifth column in which a plurality of third spacers having a fifth width shorter in length than the first width is spaced apart from each other with a specific distance in the first direction. The fifth column may be disposed between the first column and the third column.

When the foldable display device is folded, the organic emission layers may face each other.

The foldable display device further includes a third column identical to the first column and a fourth column identical to the second column. The second column and the fourth column may be disposed adjacent to each other and between the first column and the third column.

The foldable display device further includes a fifth column and a sixth column in which a plurality of third spacers having a fifth width shorter in length than the first width is spaced apart from each other with a specific distance in the first direction. The first column and the third column may be disposed between the fifth column and the sixth column.

When the foldable display device is folded, back surfaces of the substrates may face each other.

The foldable display device further includes a fifth column and a sixth column in which a plurality of third spacers having a fifth width shorter in length than the third width is spaced apart from each other with a specific distance in the first direction. The first column and the second column may be disposed between the fifth column and the sixth column.

There are at least two folding axes: one is in the second column; and the other is in the sixth column.

The foldable display device can be folded into an S-shape.

According to another aspect of the present disclosure, there is provided a display device. The display device includes a first thin film transistor including a first active layer formed of a first semiconductor material, a first gate electrode overlapped with the first active layer on a first gate insulating layer which disposed on the first active layer, and a first source electrode and a first drain electrode electrically connected to the first active layer. The display device further includes a separation insulating layer on the first thin film transistor. The display device further includes a second thin film transistor on the separation insulating layer and including a second active layer formed of a second semiconductor material different from the first semiconductor material, a second gate electrode overlapped with the second active layer on a second gate insulating layer which disposed on the second active layer, and a second source electrode and a second drain electrode electrically connected to the second active layer. Further, the second active layer of the second thin film transistor may have a first thickness and a second thickness greater than the first thickness.

An area of the second active layer overlapped with the second gate electrode may have the first thickness and an area not overlapped with the second gate electrode may have the second thickness.

An area of the second active layer overlapped with the second gate insulating layer may have the first thickness and an area not overlapped with the second gate insulating layer may have the second thickness.

An area of the second active layer overlapped with the second gate electrode and the second gate insulating layer may have the first thickness and an area not overlapped with the second gate electrode and the second gate insulating layer may have the second thickness.

The second gate electrode and the second gate insulating layer may be overlapped with each other.

The area of the second active layer overlapped with the second gate insulating layer may be formed as a single layer, and the area of the second active layer not overlapped with the second gate insulating layer may be formed as a plurality of layers.

The single layer may include the second semiconductor material. Further, the plurality of layers may include a lower layer including the second semiconductor material and an upper layer disposed on the lower layer and including a different material from the lower layer.

The upper layer of the second active layer may include a metal material.

The separation insulating layer is disposed between the first thin film transistor and the second thin film transistor.

The display device further includes contact holes overlapping with the area not overlapped with the second gate electrode having the second thickness. Also, the second thickness of the second active layer protects the second active layer from damage during formation of the contact holes.

An area of the second active layer overlapped with the second gate electrode is a single layer, and an area of the second active layer not overlapped with the second gate electrode is a plurality of layers.

The single layer of the area of the second active layer overlapped with the second gate electrode includes second semiconductor material different than the first semiconductor material, and the plurality of layers of the area of the second active layer not overlapped with the second gate electrode include a lower layer including the second semiconductor material and an upper layer disposed on the lower layer and including a different material than the lower layer.

The first semiconductor material in the first thin film transistor is a low temperature poly-silicon (LTPS) and the second semiconductor material in the second thin film transistor is an oxide semiconductor material.

The display device further includes a first interlayer insulating layer disposed on a lower surface of the separation insulating layer, a second interlayer insulating layer disposed on an upper surface of the separation insulating layer, and a connecting electrode disposed on an upper surface of the second interlayer insulating layer. Also, the connecting electrode extends through both the second interlayer insulating layer and the separation insulating layer, and the connecting electrode electrically connects the second source electrode of the second thin film transistor to the first drain electrode of the first thin film transistor.

According to yet another aspect of the present disclosure, there is provided a display device. The display device includes a first thin film transistor including a first active layer formed of a first semiconductor material, a first gate electrode overlapped with the first active layer on a first gate insulating layer which disposed on the first active layer, and a first source electrode and a first drain electrode electrically connected to the first active layer. The display device further includes a second thin film transistor including a second active layer including a second channel region, a second source region, and a second drain region and formed of a second semiconductor material different from the first semiconductor material, a second gate electrode overlapped with the second channel region of the second active layer on a second gate insulating layer which disposed on the second active layer, and a second source electrode and a second drain electrode respectively connected to the second source region and the second drain region of the second active layer. The display device further includes a separation insulating layer disposed between the first thin film transistor and the second thin film transistor. Further, the second channel region may be formed as a single layer, and the second source region and the second drain region may be formed as a plurality of layers.

The second source region may include a second source region lower layer and a second source region upper layer disposed on the second source region lower layer. Further, the second drain region may include a second drain region lower layer and a second drain region upper layer disposed on the second drain region lower layer.

The second source region lower layer and the second drain region lower layer may be formed of the same material as the second channel region.

The second source region upper layer and the second drain region upper layer may be formed of a different material from the second source region lower layer and the second drain region lower layer.

The second source region upper layer and the second drain region upper layer may be formed of a metal material.

According to yet another aspect of the present disclosure, there is provided a display device. The display device includes a first thin film transistor including a first active layer including a first channel region, a first source region and a first drain region, and the first active layer is formed of a first semiconductor material, a first gate electrode overlapping with the first active layer, and a first source electrode and a first drain electrode both electrically connected to the first active layer. The display device further includes a second thin film transistor including a second source region formed as a plurality of layers and a second drain region formed as a plurality of layers, a second active layer including a second channel region formed as a single layer, the second active layer is formed of a second semiconductor material different from the first semiconductor material, and second active layer is electrically connected to second source region and the second drain region, a second gate electrode overlapped with the second channel region of the second active layer, and a second source electrode and a second drain electrode connected to the second source region and the second drain region of the second active layer, respectively. The display device further includes a separation insulating layer disposed between the first thin film transistor and the second thin film transistor.

The second source region includes a second source region lower layer and a second source region upper layer disposed on the second source region lower layer, and the second drain region includes a second drain region lower layer and a second drain region upper layer disposed on the second drain region lower layer.

The second source region lower layer and the second drain region lower layer are formed of the same material as the second channel region.

The second source region upper layer and the second drain region upper layer are formed of a different material than the second source region lower layer and the second drain region lower layer, respectively.

The second source region upper layer and the second drain region upper layer are formed of a metal material.

The second channel region in the second thin film transistor has a first thickness, and the second source region and the second drain region each have a second thickness greater than the first thickness.

The display device further includes contact holes overlapping with the second source region and the second drain region, respectively. Also, the second thickness of the second source region and the second drain region protects the second active layer from damage during formation of the contact holes.

The first semiconductor material in the first thin film transistor is a low temperature poly-silicon (LTPS) and the second semiconductor material in the second thin film transistor is an oxide semiconductor material.

The display device further includes a first interlayer insulating layer disposed on a lower surface of the separation insulating layer, a second interlayer insulating layer disposed on an upper surface of the separation insulating layer, and a connecting electrode disposed on an upper surface of the second interlayer insulating layer. Also, the connecting electrode extends through both the second interlayer insulating layer and the separation insulating layer, and the connecting electrode electrically connects the second source electrode of the second thin film transistor to the first drain electrode of the first thin film transistor.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
an emission element including a first electrode, an emission layer on the first electrode, and a second electrode on the emission layer;
a first thin film transistor including:
a first active layer including a first semiconductor material,
a first gate electrode overlapping with the first active layer, and
a first source electrode and a first drain electrode both electrically connected to the first active layer;
a separation insulating layer disposed on the first thin film transistor;
a second thin film transistor disposed on the separation insulating layer and including:

a second active layer including a second semiconductor material different from the first semiconductor material, a second gate electrode overlapping with the second active layer, and a second source electrode and a second drain electrode both electrically connected to the second active layer;

a first interlayer insulating layer disposed on a lower surface of the separation insulating layer;

a second interlayer insulating layer disposed on an upper surface of the separation insulating layer;

a connecting electrode disposed under the first electrode to overlap with the first electrode, the connecting electrode being connected to the first drain electrode of the first thin film transistor and the second source electrode of the second thin film transistor;

a passivation layer disposed on the second interlayer insulating layer to cover the second source electrode, the second drain electrode and the connecting electrode;

an auxiliary electrode being in direct contact with the second drain electrode of the second thin film transistor through a contact hole penetrating the passivation layer and the auxiliary electrode electrically connecting the second thin film transistor with the first electrode; and a planarization layer disposed on the auxiliary electrode and the passivation layer, wherein the connecting electrode and the auxiliary electrode are disposed on upper surfaces of different layers, wherein the second active layer of the second thin film transistor has a first thickness and a second thickness greater than the first thickness, and wherein portions of the second active layer in direct contact with the second source and drain electrodes have the second thickness.

2. The display device according to claim 1, wherein the separation insulating layer is disposed between the first thin film transistor and the second thin film transistor.

3. The display device according to claim 1, wherein an area of the second active layer overlapped with the second gate electrode has the first thickness and an area not overlapped with the second gate electrode has the second thickness.

4. The display device according to claim 3, further comprising:

contact holes penetrating the second interlayer insulating layer and overlapping with the area not overlapped with the second gate electrode having the second thickness, wherein the second thickness of the second active layer protects the second active layer from damage during formation of the contact holes penetrating the second interlayer insulating layer.

5. The display device according to claim 1, wherein an area of the second active layer overlapped with the second gate electrode is a single layer, and an area of the second active layer not overlapped with the second gate electrode is a plurality of layers.

6. The display device according to claim 5, wherein the single layer of the area of the second active layer overlapped with the second gate electrode includes the second semiconductor material different than the first semiconductor material, and wherein the plurality of layers of the area of the second active layer not overlapped with the second gate electrode include a lower layer including the second semiconductor material and an upper layer disposed on the lower layer and including a different material than the lower layer.

7. The display device according to claim 6, wherein the upper layer of the second active layer includes a metal material, and wherein the metal material is any one of molybdenum (Mo), copper (Cu), titanium (Ti), aluminum (Al), chromium (Cr), gold (Au), nickel (Ni), neodymium (Nd) and alloys thereof.

8. The display device according to claim 1, wherein the first semiconductor material in the first thin film transistor is a low temperature poly-silicon (LTPS) and the second semiconductor material in the second thin film transistor is an oxide semiconductor material.

9. A display device, comprising:

an emission element including a first electrode, an emission layer on the first electrode, and a second electrode on the emission layer;

a first thin film transistor including:
 a first active layer including a first channel region, a first source region and a first drain region, and the first active layer is formed of a first semiconductor material,
 a first gate electrode overlapping with the first active layer, and
 a first source electrode and a first drain electrode both electrically connected to the first active layer;

a second thin film transistor including:
 a second source region formed as a plurality of layers and a second drain region formed as a plurality of layers,
 a second active layer including a second channel region formed as a single layer, the second active layer is formed of a second semiconductor material different from the first semiconductor material, and the second active layer is electrically connected to the second source region and the second drain region,
 a second gate electrode overlapped with the second channel region of the second active layer, and
 a second source electrode and a second drain electrode connected to the second source region and the second drain region of the second active layer, respectively;

a separation insulating layer disposed between the first thin film transistor and the second thin film transistor;

a first interlayer insulating layer disposed on a lower surface of the separation insulating layer;

a second interlayer insulating layer disposed on an upper surface of the separation insulating layer;

a connecting electrode disposed under the first electrode to overlap with the first electrode, the connecting electrode being connected to the first drain electrode of the first thin film transistor and the second source electrode of the second thin film transistor;

a passivation layer disposed on the second interlayer insulating layer to cover the second source electrode, the second drain electrode and the connecting electrode;

an auxiliary electrode being in direct contact with the second drain electrode of the second thin film transistor through a contact hole penetrating the passivation layer and the auxiliary electrode electrically connecting the second thin film transistor with the first electrode; and a planarization layer disposed on the auxiliary electrode and the passivation layer, wherein the connecting electrode and the auxiliary electrode are disposed on upper surfaces of different layers.

10. The display device according to claim 9, wherein the second source region includes a second source region lower layer and a second source region upper layer disposed on the second source region lower layer, and
wherein the second drain region includes a second drain region lower layer and a second drain region upper layer disposed on the second drain region lower layer.

11. The display device according to claim 10, wherein the second source region lower layer and the second drain region lower layer are formed of the same material as the second channel region.

12. The display device according to claim 11, wherein the second source region upper layer and the second drain region upper layer are formed of a different material than the second source region lower layer and the second drain region lower layer, respectively.

13. The display device according to claim 12, wherein the second source region upper layer and the second drain region upper layer are formed of a metal material, and
wherein the metal material is any one of molybdenum (Mo), copper (Cu), titanium (Ti), aluminum (Al), chromium (Cr), gold (Au), nickel (Ni), neodymium (Nd) and alloys thereof.

14. The display device according to claim 9, wherein the second channel region in the second thin film transistor has a first thickness, and the second source region and the second drain region each have a second thickness greater than the first thickness.

15. The display device according to claim 14, further comprising:
contact holes penetrating the second interlayer insulating layer overlapping with the second source region and the second drain region, respectively,
wherein the second thickness of the second source region and the second drain region protects the second active layer from damage during formation of the contact holes penetrating the second interlayer insulating layer.

16. The display device according to claim 9, wherein the first semiconductor material in the first thin film transistor is a low temperature poly-silicon (LTPS) and the second semiconductor material in the second thin film transistor is an oxide semiconductor material.

17. The display device according to claim 9, wherein the first thin film transistor is spaced apart from the second thin film transistor without overlapping with the second thin film transistor in a vertical direction perpendicular to the separation insulating layer,
wherein the second thin film transistor is disposed under the first electrode and overlaps with the first electrode in the vertical direction,
wherein the first thin film transistor is spaced apart from the first electrode without overlapping with the first electrode in the vertical direction, and
wherein the connecting electrode penetrates through the separation insulating layer and the second interlayer insulating layer disposed on the upper surface of the separation insulating layer.

* * * * *